United States Patent [19]

Nishizawa et al.

[11] Patent Number: 4,660,062
[45] Date of Patent: Apr. 21, 1987

[54] INSULATED GATE TRANSISTOR HAVING REDUCED CHANNEL LENGTH

[75] Inventors: Junichi Nishizawa; Tadahiro Ohmi, both of Miyagi, Japan

[73] Assignee: Handotai Kenkyu Shinkokai, Miyagi, Japan

[21] Appl. No.: 532,940

[22] Filed: Sep. 16, 1983

[30] Foreign Application Priority Data

Sep. 16, 1982 [JP] Japan .................. 57-161980

[51] Int. Cl.$^4$ .......................................... H01L 29/78
[52] U.S. Cl. ..................... 357/23.3; 357/41; 357/42; 357/23.6; 357/22
[58] Field of Search ............. 357/22, 23 SC, 23 VD, 357/41, 55, 42, 23.3, 23.4, 23.6, 50, 67 S

[56] References Cited

U.S. PATENT DOCUMENTS

| | | | |
|---|---|---|---|
| 3,975,752 | 8/1976 | Nicolay | 357/22 |
| 4,003,126 | 1/1977 | Holmes | 357/55 |
| 4,131,907 | 12/1978 | Ouyang | 357/42 |
| 4,141,022 | 2/1979 | Sigg | 357/67 S |
| 4,243,997 | 1/1981 | Natori | 357/23.4 |
| 4,295,267 | 10/1981 | Harrington | 357/22 |
| 4,316,203 | 2/1982 | Tohgei | 357/23 VD |

FOREIGN PATENT DOCUMENTS

| | | | |
|---|---|---|---|
| 52-14388 | 2/1977 | Japan | 357/42 |
| 55-78572 | 6/1980 | Japan | 357/42 |
| 55-111171 | 8/1980 | Japan | 357/23.3 |
| 56-38860 | 4/1981 | Japan | 357/23.6 |
| 0032757 | 4/1981 | Japan | 357/23 SC |

OTHER PUBLICATIONS

IEEE Electron Device Letters vol. 3 #2 Feb. 1982, pp. 37-40 357/67S by Chow.
IEEE Transactions on Electron Devices vol. 29 #3 Mar. 82 pp. 368-376 by Ohta.
Solid State Electronics, vol. 19 #2, pp. 159-166 Feb. 76 by Mok, ". . . A V Shaped Channel FET" 35722V.

*Primary Examiner*—Andrew J. James
*Assistant Examiner*—Mark Prenty
*Attorney, Agent, or Firm*—Sughrue, Mion, Zinn, Macpeak & Seas

[57] ABSTRACT

An insulated gate transistor including a semiconductor substrate, high impurity source and drain regions formed above a channel region of low conductivity, a high impurity concentration region having a conductivity type opposite to that of the source region, a gate insulating layer extending into the channel region farther inwardly of the substrate than the source region, and a gate electrode positioned on the gate insulating layer. The gate electrode is made of a material having a high potential barrier with respect to the source region. The insulated gate transistor may be used as a driver transistor in an integrated circuit, as a switching transistor in a dynamic RAM memory cell, static RAM memory cell and in a complementary configuration.

22 Claims, 21 Drawing Figures

INSULATED GATE TRANSISTOR HAVING REDUCED CHANNEL LENGTH

BACKGROUND OF THE INVENTION

The present invention relates to an insulated gate transistor, the channel length of which is minimized to provide high density packaging and to improved the speed and the power-delay performance. Further, the invention relates to various circuits and circuit structures employing such transistors.

Much effort has been made to shorten the channel length of field effect transistors (hereinafter, MOSFETs) to make it possible to increase the number of MOSFETs that can be fabricated on one chip. When the channel length of a MOSFET is shortened, other parameters of the device must be appropriately scaled. A detailed description of such scaling is given in Japanese Patent Application No. 113,709/82. As explained therein, shortening the channel length is necessarily accompanied by an increase in the concentration of impurities in the channel and hence a corresponding decrease in the mobility of carriers in the channel. The effective carrier mobility in the channel is further reduced because the carriers induced beneath the gate insulating layer are distributed to a depth of only about 100 Å or less. This reduced carrier mobility results in a smaller transconductance. As a further difficulty, the input capacitance of the gate is increased when the channel length is shortened. Moreover, the reduction in the channel length is not accompanied by a commensurate improvement in the transistor performance. Another problem is a lowered drain breakdown voltage.

The inventors have conducted various studies to develop an insulated gate electrostatic induction transistor (hereinafter, MOSSIT) free from the above-described difficulties. An improved MOSSIT resulting from these studies is described in Japanese Patent Applications Nos. 108,377/79, 115,491/79 and 113,709/82. Each of the MOSSITs proposed in these applications provides the following four advantages:

(1) the concentration of impurities in the channel is low enough to enable the induced carriers to penetrate deeply into the channel;

(2) the transistor has a high carrier mobility in the channel, thereby providing a greater transconductance;

(3) the transistor has a smaller gate input capacitance so that shortening the channel length is accompanied by a corresponding increase in the operating speed of the transistor; and (4) the transistor consumes less power and has an increased drain breakdown voltage.

The present invention is a further improvement on these MOSSITs. It is a primary object of the invention to provide an integrated semiconductor circuit using an insulated gate electrostatic induction transistor that has a greatly shortened channel.

SUMMARY OF THE INVENTION

In accordance with this and other objects of the invention, there is provided an insulated gate transistor including a semiconductor substrate, a source region and a drain region formed in a surface of the semiconductor substrate with the source and drain regions having a high impurity concentration. A channel region formed on the semiconductor substrate extends between the source and drain regions. The channel region has a low impurity concentration. A gate insulating layer extends into the channel region farther inwardly of the substrate than the source region. A gate electrode is positioned on the gate insulating layer. The gate electrode has a high impurity concentration and is of a conductivity type opposite that of the source region. Further, the gate electrode is made of a material having a high potential barrier with respect to the source region. The insulated gate transistor may advantageously be used as a driver transistor in an integrated circuit device, as a switching transistor in logic circuits, a dynamic RAM memory cell and a static RAM memory cell, and in a complementary MOS configuration.

DESCRIPTION OF THE PREFERRED EMBODIMENTS

The present invention will hereinafter be described in detail with reference to the accompanying drawings.

As mentioned above, an important feature of a MOSSIT is the low concentration of impurities in the channel. Because of this feature, MOSSITs have a high breakdown voltage. In a conventional MOSFET, the effect of the applied drain voltage is localized in the channel near the drain edge, but in a MOSSIT, the effect of the same drain voltage is distributed over a fairly wide area, so that the intensity of the resulting electric field is low enough to minimize variations in the transistor's threshold voltage due to the injection of hot electrons.

Figure 1:
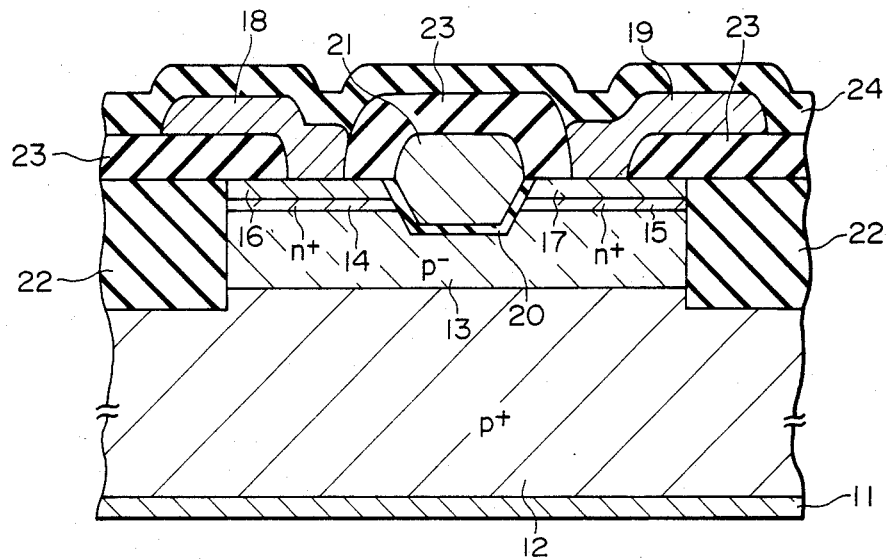
FIGS. 1, 2 and 8 are cross-sectional views showing three embodiments of an insulated gate transistor of the present invention.

A cross section of a MOSSIT of the present invention according to a first preferred embodiment is shown in FIG. 1, wherein reference numeral 11 designates a substrate electrode, 12 a p+ substrate, 13 a high-resistivity p− region, 14 and 15 n+ source and drain regions, 16 and 17 $MoSi_2$ or $WSi_2$ layers, 18 and 19 an Al, AlSi or AlCu electrode, 20 an oxide gate insulating layer, 21 a gate electrode, 22 an isolation region, 23 a PSG (phosphosilicate glass) film, and 24 a PSG film or plasma nitride film for passivation.

The region 13 is a high-resistivity region having a low impurity concentration, for example, $1 \times 10^{15}$ cm$^{-3}$ or less, preferably $1 \times 10^{14}$ cm$^{-3}$ or less. A normally off characteristic of the MOSSIT is not provided by increasing the impurity concentration of the channel as in a conventional MOSFET with decreasing the channel length. Instead, the diffusion potentials of the p+ substrate 12 and the work function of the gate electrode 21 with respect to the n+ source region 14 are appropriately set so that the desired normally off characteristic is provided. More specifically, a potential barrier is formed within the channel due to the relative diffusion potentials of the p+ substrate and the work function of the gate electrode which imparts the normally off characteristic.

The gate electrode 21 is preferably made of a material that presents a high potential barrier with respect to the n+ source region 14. For example, a high diffusion potential can be provided by using p+ polycrystalline silicon as the material for the part of the gate electrode 21 which is adjacent the gate insulating layer 20. If p+ polycrystalline silicon material excessively increases the resistance of the gate electrode 21, it may be overlaid with a silicide layer or metal electrode. For example, a boron-doped silicon-rich molybdenum silicide or tungsten silicide layer formed by sputtering or other suitable means such as CVD and annealed is suitable. By this procedure, a gate electrode is produced having a p+ polycrystalline silicon layer deposited on the part thereof adjacent the oxide gate insulating layer 20 and a $MoSi_2$ or $WSi_2$ layer formed above the p+ polycrystalline silicon layer. Needless to say, the gate electrode may be made of Al or AlSi; even Al provides a diffusion potential of about 0.7 volts with respect to the n+ region 14. Other metals or metal silicides may also be used.

Source electrode components 14 and 16, as well as drain electrode components 15 and 17, may be produced by the following procedure. A Mo or W film having a thickness of about 100 Å to several hundred angstroms is formed on the p− channel layer by sputtering or chemical vapor deposition (CVD). Ions of an impurity such as As are then implanted into the p− channel region through the Mo or W layer in a high concentration. The As ions pass through the Mo or W layer and damage the Si layer directly beneath the Mo or W layer, converting it to a near-amorphous state. The dose of As is generally on the order of $1 \times 10^{15}$ to $1 \times 10^{16}$ cm$^{-2}$. The depth of the amorphous Si layer is equal to or slightly greater than the thickness of the Mo or W layer. By subsequently heating the assembly at around 600° C., $MoSiO_2$ or $WSi_2$ forms. This is a very stable compound and will adequately withstand subsequent heating up to about 1,100° C. (See E. Nagasawa, M. Morimoto and H. Obabayashi, "Mo-Silicide Low Resistance Shallow Junctions", Dig. Tech. Papers on 1982 Symp. on VLSI Technologies, pp. 2-4). Therefore, the injected As ions can be satisfactorily activated by this method. Usually, the silicide formed is reduced in a volume and placed under tensile stress, which can cause a dislocation. However, the silicide film formed by the above method is so thin that the resulting tensile stress is not great enough to reach the critical value for the development of a dislocation. If the required thickness of the silicide film is so large that tensile stress may occur, a large amount of Si ions may be injected together with As. In this way, a very shallow n+ region can be formed. (This technique was developed by Hidekazu Okabayashi et al. of Nippon Electric Co., Ltd. and reported at the Mar. 5, 1982 meeting of the Study Group of Electronic Devices, The Institute of Electrical Engineers of Japan.) By this technique, a very shallow junction which is only several hundred angstroms deep can be easily formed in an n+ or a p+ region.

In the embodiment of FIG. 1, the region 13 is a p− region, but it may be an n− region because the potential distribution in the channel is substantially independent of the conductivity type as long as the impurity concentration is less than about $1 \times 10^{14}$ cm$^{-3}$. If the depth of the p− region is denoted by D and the effective length of the channel by L, the transistor of FIG. 1 will retain a normally off characteristic to the extent it satisfies the relationship:

$$\frac{L}{D} \geq 1.$$

This of course assumes that the substrate of the transistor is not biased. The basic concept of a MOSSIT is to permit the greatest number of the carriers induced in the channel to flow to the deepest area of the channel. Therefore, the substrate is usually not reverse biased. In the embodiment of FIG. 1, the effective length of the channel can be reduced until it becomes equal to or even slightly larger than D, the depth of the high-resistivity region 13. This means a significant reduction in the channel length can be accomplished quite easily.

As described in Japanese Patent Application No. 113,709/82, the channel of a MOSSIT should have a low impurity concentration so that the effect of the drain voltage reaches the deepest possible area of the channel. Because of this low impurity concentration, the drain voltage is not localized but is distributed over a relatively wide area. The resultant electric field is so weak that the transistor is less susceptible to the adverse effects of hot electrons. On the other hand, the transistor is subject to the space-charge effect of the induced carriers. In the conventional MOSFET, this effect is cancelled by the gate electrode, and is almost absent in the voltage region exhibiting triode like I-V characteristic until the drain voltage reaches saturation. Once the drain voltage reaches or exceeds the saturation level, electric force lines originating from the space charges of the induced carriers in the channel near the drain side tend to terminate on the drain electrode. As a result, the space-charge effect of the induced carriers becomes significant and the channel exhibits a resistance sufficiently high to saturate the drain current of the MOSFET. To construct a MOSSIT that prevents a lower resistance than the conventional MOSFET in the conductive state, the channel length must be reduced to some extent. Generally, the MOSSIT is advantageous over the MOSFET if the channel is not longer than about 1 μm.

One important feature of the MOSSIT shown in FIG. 1 is that the gate insulating layer 30 extends into the channel to a position farther inward than the n+ source region 14. The impurity concentration of the p+ substrate 12 is primarily determined in consideration of the conditions of the high diffusion potential with respect to the source region 14.

The diffusion potential $\phi_{bl}$ is given by the following formula:

$$\phi_{bl} = \frac{KT}{q} \ln \frac{N_D N_A}{n_i^2},$$

where q is the electron (unit) charge, K is Boltzmann's constant, T is the temperature, and $n_i$ is the intrinsic carrier concentration. $N_D$ and $N_A$ are the impurity concentration of the n+ source region 14 and the p+ substrate 12, respectively. The impurity concentration of the p+ substrate is usually set at $1 \times 10^{17}$ cm$^{-3}$ or higher.

Figure 2:
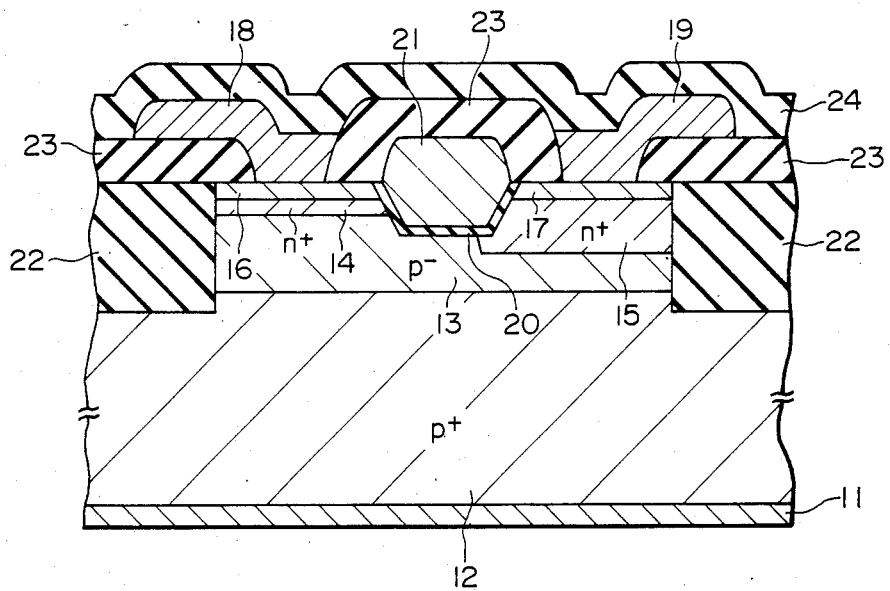

In the embodiment of FIG. 1, the source and drain are arranged in a practically symmetrical form. Alternatively, the n+ region 15 on the drain side may extend deeper into the channel than the n+ region 14 on the source side so that the resistance of the transistor in the conductive state is decreased. Of course, the n+ region 15 on the drain side should not be deep enough to increase the drain capacitance and hence reduce the operating speed of the transistor. An embodiment wherein the n+ drain region 15 is made somewhat deeper than the n+ source region 14 is illustrated in FIG. 2. The MOSSITs shown in FIGS. 1 and 2 are primarily intended for use as driver transistors in a logic circuit.

Figure 3:
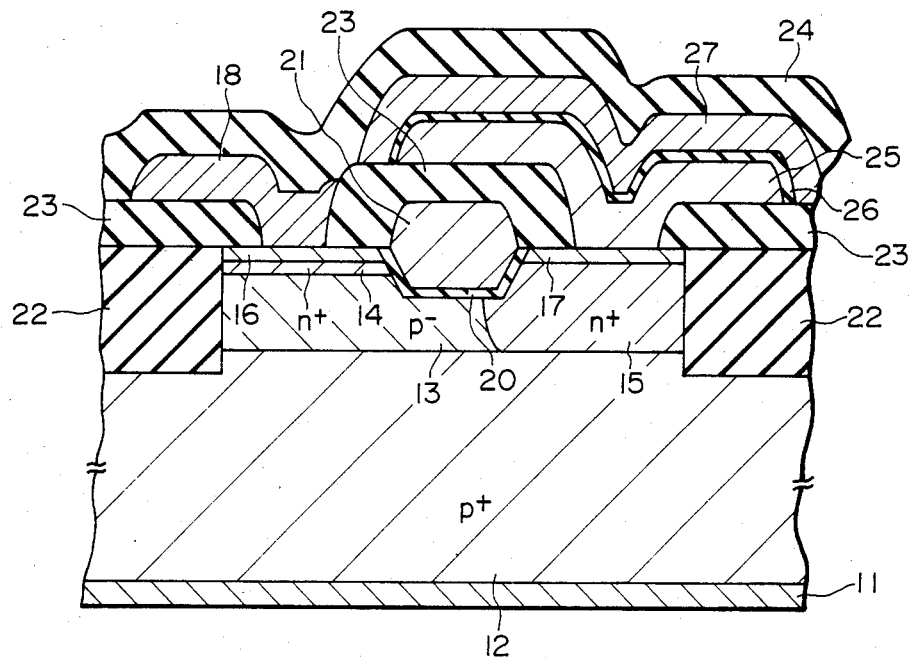
FIGS. 3 and 4 are cross-sectional views of two embodiments of an insulated gate transistor of the present invention employed in a dynamic RAM cell.

An embodiment of the present invention wherein the inventive MOSSIT is used in a dynamic RAM cell is shown in FIG. 3. In this embodiment, the n+ drain region 15 is placed in direct contact with the p+ substrate 12 in order to increase the storage capacitance $C_s$. Other components are an n+ polycrystalline silicon region 25, a thin insulating layer 26 made of $SiO_2$, $Si_3N_4$ or $SiO_xN_y$, and a metal electrode (Al, AlSi or AlCu) 27. In order to provide a maximum storage capacitance $C_s$ for a given area, the insulating layer 26 is preferably made of a material having a high dielectric constant and a wide band gap. For example, $Ta_2O_5$ has a relative dielectric constant of about 22. The region 25 is typically made of n+ polycrystalline silicon, but any other material may be used if a good insulating material can be derived from it. Suitable examples are Ta and Al. In the case of Ta, $Ta_2O_5$ may be used, and with Al, $Al_2O_3$ or AlN can be used.

By bringing the n+ drain region 15 into direct contact with the p+ substrate 12, the storage capacitance $C_s$ is increased. By increasing $C_s$, both regions desirably have higher impurity concentrations. However, at excessively high purity concentrations, tunneling and other undesired effects may occur which could swamp the stored signal. To prevent this unwanted phenomenon, at least one of the two adjacent regions 12 and 15 must have an impurity concentration of not more than about 2 to $3 \times 10^{17}$ cm$^{-3}$. This upper limit can be increased gradually as the input WRITE voltage to the cell is reduced.

Figure 4:
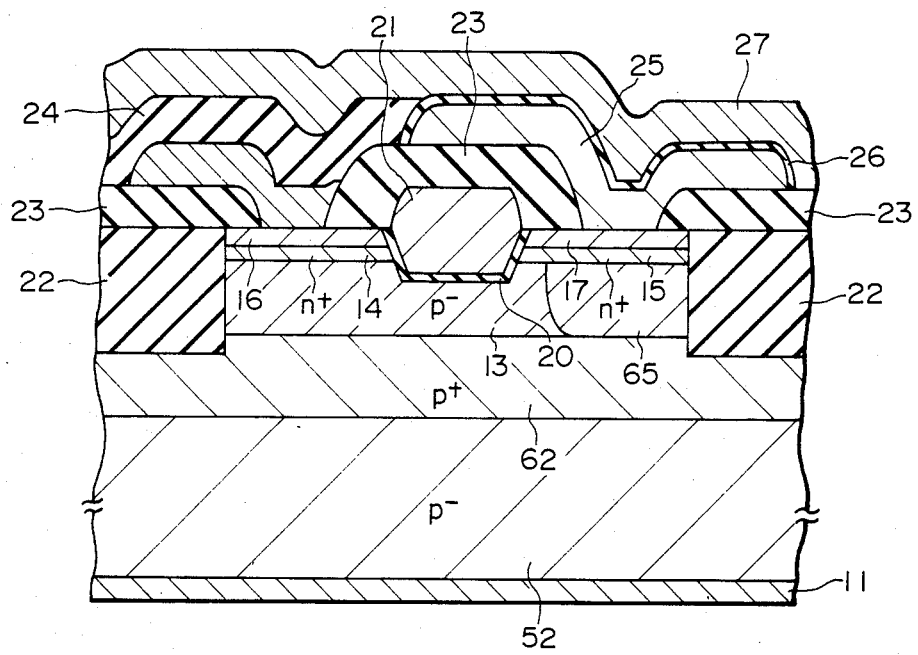

In the source embodiment of FIG. 3, the electrode 18 serves as a bit line and the gate electrode 21 functions as a word line. To increase the operating speed, the capacitance of the word line must be small. However, in FIG. 3, the n+ region 15 is deep enough to reach the underside of the gate insulating layer, and thus increase the gate capacitance. To avoid this, the embodiment shown in FIG. 4 may be employed. In this device, an n+ region 65 is spaced from the gate insulating layer 20. The n+ region 65 may be omitted if the total capacitance of elements 25, 26 and 27 provides the necesssary storage capacitance.

The transistor of FIG. 3 is reasonably protected against "soft" error due to exposure to alpha rays because it is designed to have a short lifetime of carriers in the p+ substrate 12. The transistor of FIG. 4 though is more resistant to such soft error. It has a p+ region 62 formed only between the p− channel region 13 and a p− substrate 52. With this structure, the electrons excited by alpha rays underneath the p+ region 62 are repelled by the diffusion potential across the p+/p− junction and will not flow into the signal storage region. The diffusion potential across the p+/p− junction is given by:

$$\frac{KT}{q} \ln \frac{N_A^+}{N_A^-},$$

where $N_A^+$ is the impurity concentration of the p+ region 62 and $N_A^-$ that of the p− substrate 52.

As more devices are packed on one chip, the power consumption of each device becomes a factor in determining the upper limit of the degree of integration. In the absence of forced cooling with air or water, the upper limit of the power consumption allowed for one chip is generally about one watt. Therefore, as the physical dimensions of a single device are reduced and the packaging density of such devices increased, the need for complementary MOS (CMOS) structures, which consume less power, increases. Even CMOS structures however, dissipate power in the transient period of switching. To simultaneously satisfy requirements for both high-speed operation and low power consumption, each of the n-channel MOS transistor and p-channel MOS transistor that make up each CMOS device must have a large transconductance and a small gate input capacitance. As stated previously herein, the MOSSIT of the present invention is characterized by a loqw impurity concentration in the channel through which carriers flow, thus providing a smaller gate input capacitance. In addition, carriers flow deeply into the channel region which is substantially free from impurities. Thus, the MOSSIT of the present invention has the advantage of increased transconductance. Furthermore, the MOSSIT shown in FIG. 1 has a small drain capacitance and hence can be effectively used to construct CMOS devices that have very high operating speeds and very low power consumption.

Figure 5:
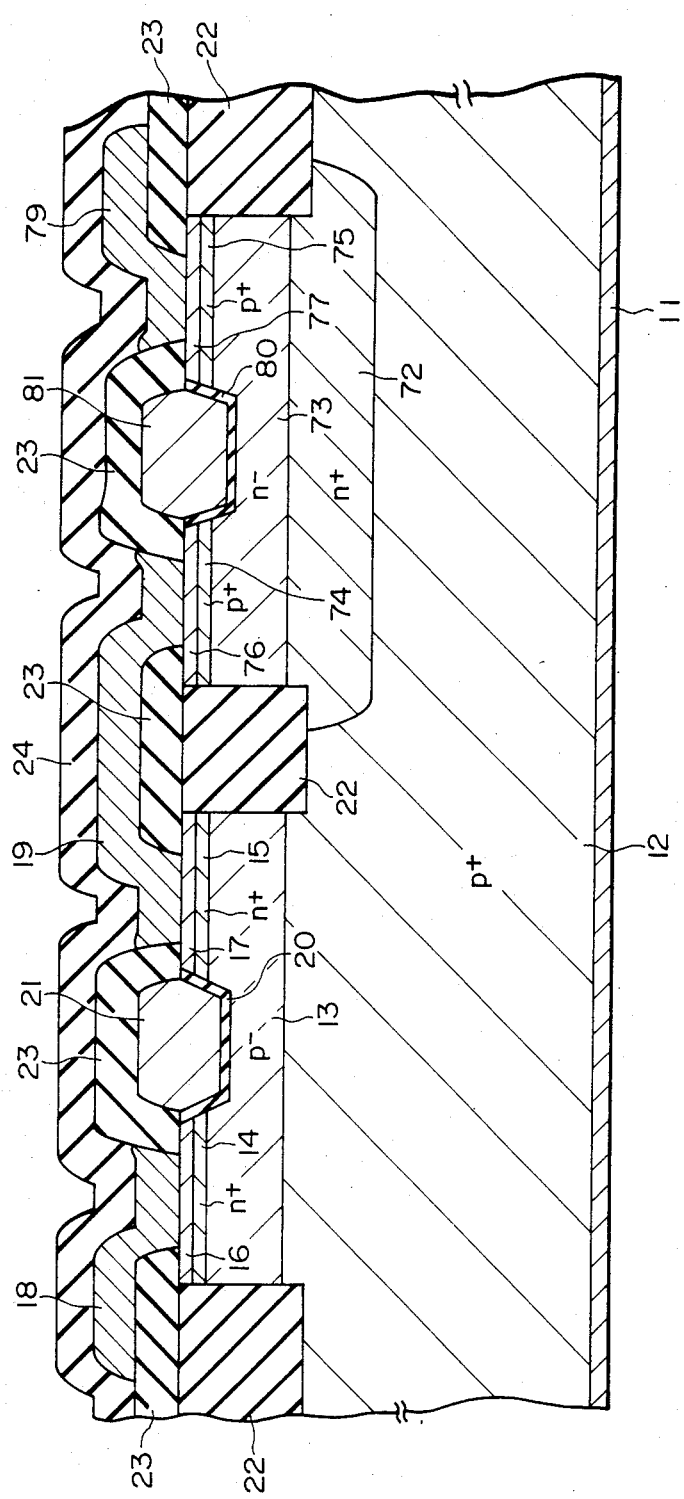
FIGS. 5 and 6 are cross-sectional views of two embodiments of CMOS devices employing insulated gate transistors of the present invention.

An embodiment of a CMOS device using the MOSSIT of FIG. 1 as an n-channel transistor and a P-channel transistor is illustrated in FIG. 5. Basically, this CMOS device is composed of the n-channel MOSSIT of FIG. 1 connected to a p-channel MOSSIT formed on an n+ region 72 (impurity concentration on the order of $1 \times 10^{18} \sim 1 \times 10^{19}$ cm$^{-3}$) provided in a selected area of a p+ substrate 12 having an impurity concentration on the order of $1 \times 10^{17} \sim \times 10^{18}$ cm$^{-3}$. The respective components of the p-channel MOSSIT are an n− high-resistivity region 73, a thin p+ drain region 74, a thin p+ source region 75, thin $MoSi_2$ or $WSi_2$ layers 76 and 77, a metal (Al, AlSi or AlCu) electrode 79, a gate insulating layer 80, and a gate electrode 81 having a high diffusion potential with respect to the p+ source region. The gate electrode 81 may be made of a n+ polysilicon, or a metal such as Al, AlSi or AlCu, or a silicide such as $MoSi_2$, $WSi_2$, $TiSi_2$, $TaSi_2$, $PtSi$, $NiSi_2$ or $Pd_2Si$.

To further increase the diffusion potential between the p+ source region and the gate electrode, a phosphorus-doped silicon-rich molybdenum silicide or tungsten silicide layer may be deposited on the gate insulator 80 by sputtering or CVD. By subsequent annealing, excess silicon builds up as n+ polycrystalline silicon to cover the area in the vicinity of the gate insulated layer, and a $MoSi_2$ or $WSi_2$ layer is formed on the n+ polycrystalline silicon layer. One or more of the materials listed above may be combined.

In normal operation, the p+ substrate 12 is held at a potential equal to that of the source electrode 18 of the n-channel MOSSIT, while the potential of the n+ buried region 72 is held equal to that of the source electrode 79 of the p-channel MOSSIT. The electrode 19 connects the drains of the two MOSSITs.

Figure 6:
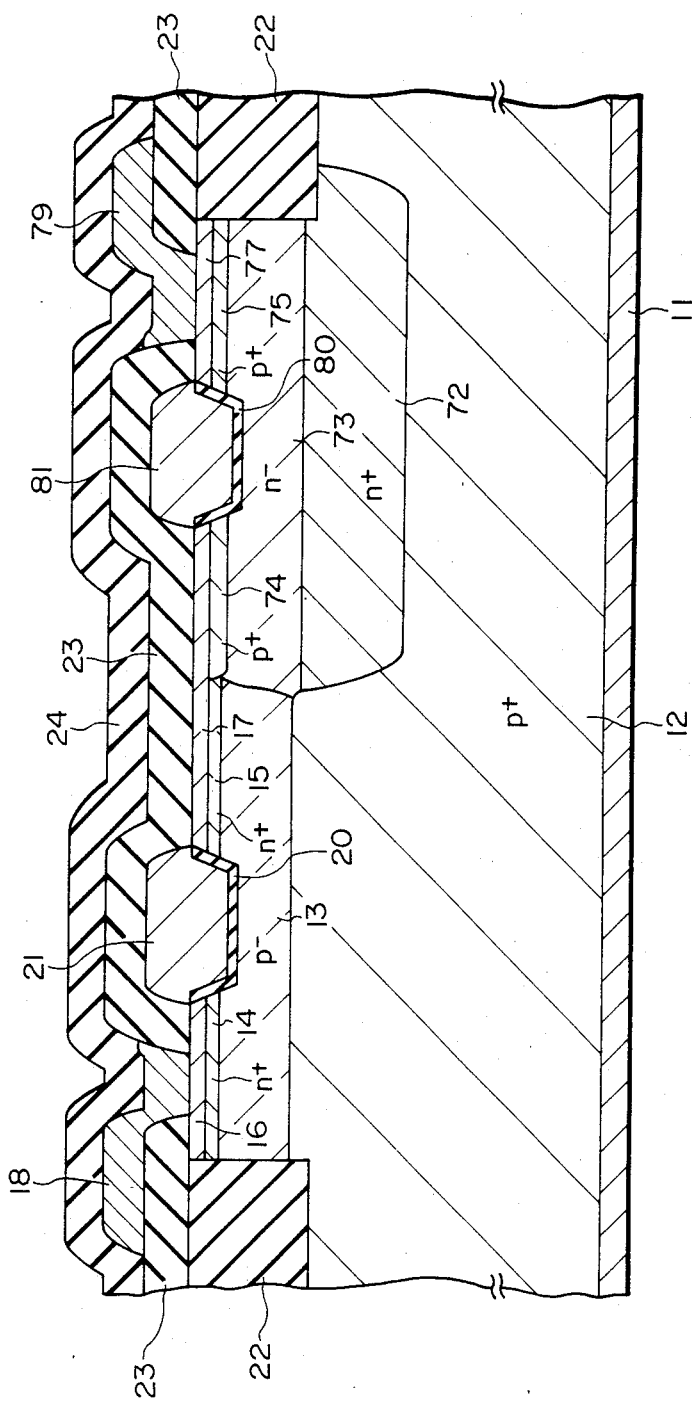

Obviously, the embodiment of FIG. 5 has very small gate and drain capacitances and makes good advantage of the CMOS configuration. In FIG. 5, an isolation region 22 is provided between the n-channel MOSSIT and p-channel MOSSIT, but this region may be omitted as shown in FIG. 6. In the embodiment of FIG. 6, the isolation region 22 is replaced by the thin wide silicide region 17 that covers the adjacent n+ drain region 15 and p+ drain region 74. The omission of the isolation region leads to a corresponding increase in the degree of integration of MOSSITs. Nevertheless, care must be taken to prevent a current from flowing between the drain region and the substrate. If the thin silicide region 17 causes an excessive increase in resistance and limits the operating speed of the CMOS, an subsidiary metal electrode may be provided on that region. The other elements of the embodiment of FIG. 6 are basically the same as in FIG. 5.

Figure 7A:
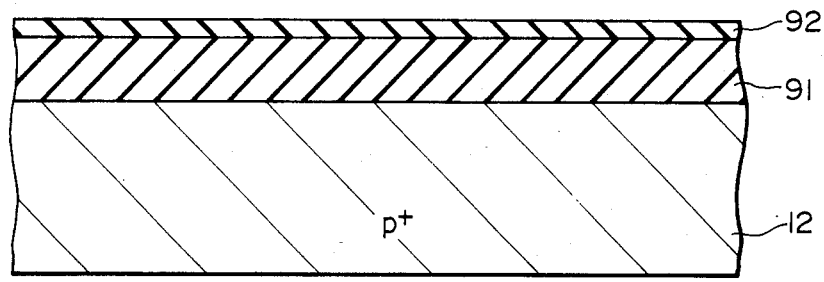
FIGS. 7A to 7G, FIGS. 9A to 9E, and 10A and 10B illustrate three preferred embodiments of processes for fabricating insulated gate transistors of the present invention.
Figure 7B:
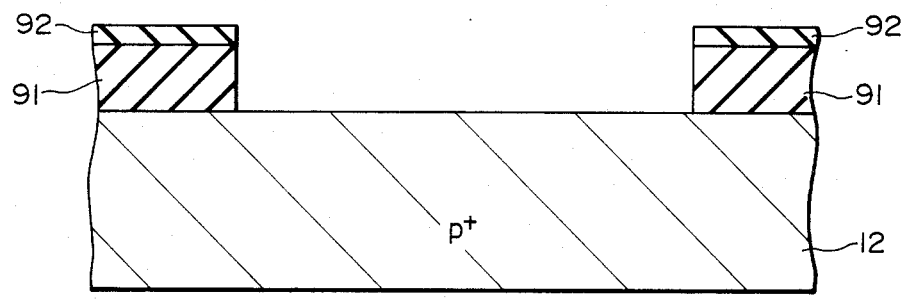
Figure 7C:
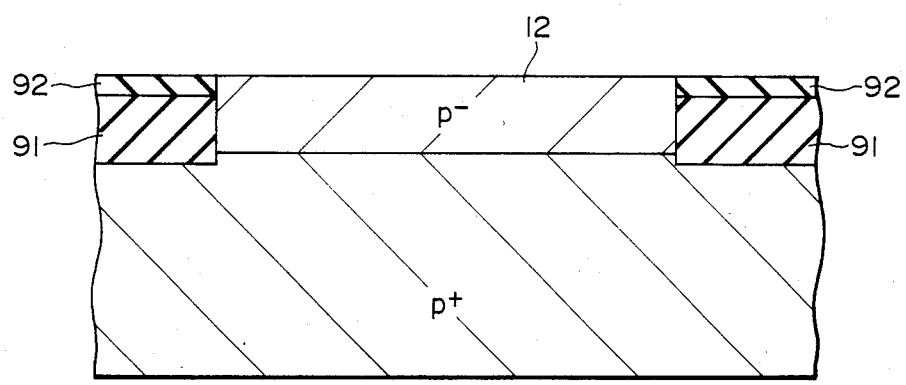

The MOSSIT of the present invention can be fabricated using various processes. A process using a selective epitaxial growth self-aligning step involving lift-off will be described with reference to FIGS. 7A to 7G. The first step is to form an oxide film 91 and a nitride film 92 on a p+ substrate 12 having an impurity concentration on the order of $1 \times 10^{17}$ to $1 \times 10^{19}$ cm$^{-3}$ (FIG. 7A). The thickness of the oxide film depends on the channel length, and the shorter the channel, the thinner the oxide film. The oxide film may be produced by wet oxidation or steam oxidation and in some cases subsequent CVD to increase the film thickness. Its thickness should generally be equal to or less than the channel length, preferably, not greater than 1 $\mu$m. The thickness of the nitride can range from several hundred angstroms to about 2,000 Å. The next stop is to etch away the parts of the nitride and oxide films which correspond in position to the region in which the device is to be formed (FIG. 7B). The third step is to form a generally flat-surfaced high-resistivity region 12 by low pressure epitaxial growth with material gases of SiH$_2$Cl$_2$, H$_2$ and HCl (FIG. 7C). In FIG. 7C, the epitaxial region 12 is of the p$^-$ type, but it may be an n$^-$ region if its impurity concentration is lower than a certain level. Of course, the epitaxial region 12 may be an intrinsic one which is substantially free from impurities. Then, a Mo or W film is deposited to a thickness of about 100 Å to several hundred augstroms by sputtering or CVD. Subsequently, As ions are implanted in a dose of about $1 \times 10^-$ to $1 \times 10^{16}$ cm$^{-3}$ at an acceleration voltage selected so that the injected As ions penetrate the Mo or W layer and convert almost all of the Si layer lying under the Mo or W layer into an amorphous region whose thickness is generally equal to or several times the thickness of the Mo or W film. For example, if the thickness of the Mo layer is about 100 Å, the acceleration voltage is set at between about 150 to 200 kV.

Figure 7D:
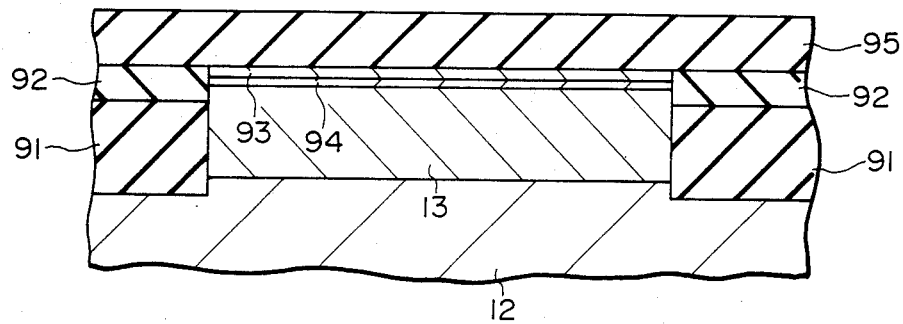
Figure 7E:
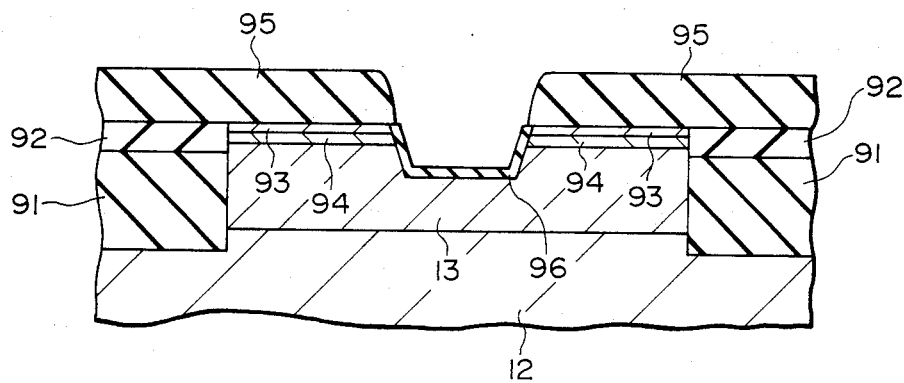

The assembly is then heated at 600° C. to initiate the reaction between Mo or W and Si to form a MoSI$_2$ or WSi$_2$ layer 93. By subsequent heating at higher temperatures, As is activated to form a thin n+ layer 94. When MoSi$_2$ or WSi$_2$ is formed as a result of reaction between Mo or W and Si, the volume of this region is decreased, and the resulting tensile stress cause dislocations to occur. However, if the MoSi$_2$ or WSi$_2$ layer is very thin, the tensile stress will not exceed the critical level for the development of dislocations. The problem of tensile stress may be partially eliminated by implanting a large amount of Si ions together with As ions. Then, the residual Mo or W film is removed from the nitride layer, and a PSG or AsSG filmf 95 is formed by CVD (FIG. 7D). The next step is a photolithographic step used to etch away parts of layers 95, 94 and 93 wherein the gate insulating layer is to be formed, as well as some parts of the high-resistivity region 13, and to construct a SiO$_2$ gate insulating layer 96 in the resulting recess by dry oxidation or (H$_2$+O$_2$) combustion oxidation, plasma oxidation or plasma nitridization (FIG. 7E). Since Si penetrates through MoSi$_2$ or WSi$_2$, the SiO$_2$ film 96 is also formed on MoSi$_2$ or WSi$_2$. Subsequently, a boron-doped silicon-rich molybdenum silicide or tungsten silicide film is deposited on the insulating layer by sputtering or CVD.

Figure 7F:
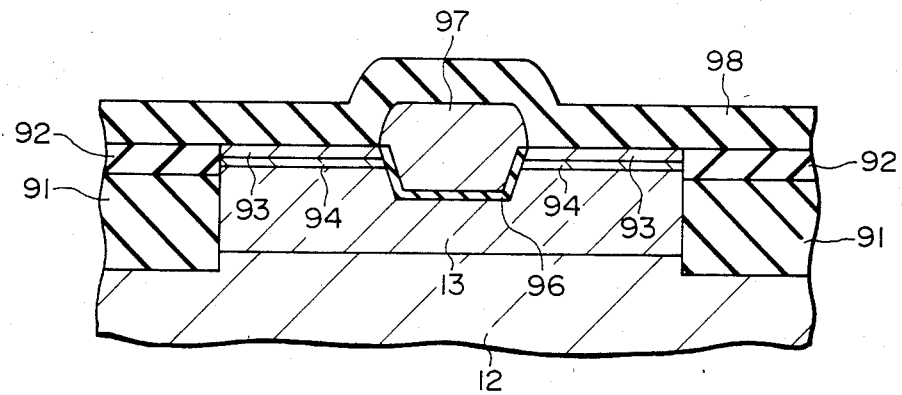

With the Mo or W to Si ratio being set at about 1:3, the assembly is heated to produce a gate electrode 97 composed of a p+ polycrystalline silicon layer that is in contact with the gate insulating layer 96 and an overlying MoSi$_2$ or WSi$_2$ layer. Thereafter, the layer 95 is etched away and the residual MoSi$_2$ or WSi$_2$ and other contaminants are lifted off, leaving only the p+ polycrystalline silicon 97 and MoSi$_2$ or WSi$_2$ layers 93 on the gate insulating layer. A PSG film 98 that covers the whole surface of the device is then formed by CVD, plasma CVD or photo-excited CVD (FIG. 7F).

Figure 7G:
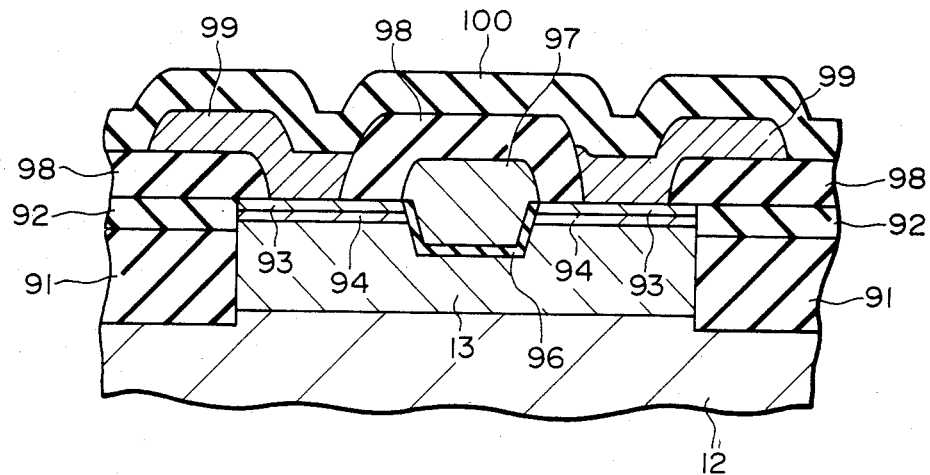

None of the steps described above involve a difficult mask aligning step. The length L of the channel is determined by the etching step illustrated in FIG. 7E. The step shown in FIG. 7F is followed by a photolithographic step (including mask alignment) wherein contact holes are formed and a layer of Al, AlSi or a suitable metal is formed by vacuum evaporation, sputtering or CVD (including plasma CVD or photo-excited CVD). In the subsequent photolithographic step, selected parts are etched away, leaving only the metal layer. Finally, a PSG or Si$_3$N$_4$ film 100 is formed by plasma CVD or photo-excited CVD to provide a protective passivating layer (FIG. 7G). The cross-sectional view of the completed device of FIG. 7G is the same as that of FIG. 1.

When contact holes are formed in a PSG film or like material, a very sharp edge is usually left around each contact hole. Plasma CVD or photo-excited low pressure CVD has a very high step coverage and can be used to deposit metal in the contact holes without leaving any discontinuities with sharp edges that may cause poor electrical contact. Therefore, an Al, AlSi or AlCu film can be effectively deposited over the PSG film and the contact holes by plasma CVD or light-excited CVD, and no preliminary step of causing the PSG to flow is necessary. However, if vacuum evaporation or sputtering is used to deposit an Al, AlSi or AlCu film, it must be preceded by a glass flowing step to provide gradual edges on the PSG film. This glass flowing step can be effected at low temperature by heating only the selected area with a CO$_2$ laser that generates laser light having a wavelength of 9.3 $\mu$m. Nevertheless, for the purpose of smaller dimensions and a higher degree of integration, forming contact holes with as sharp edges is possible and depositing Al, AlSi or AlCu film by low pressure CVD is a preferred technique. Although this step requires great dimensional accuracy, short channels with minimum variations in size can be easily produced because the channel length is determined by self-alignment that depends on the lift-off procedure. More specifically, with n+ source and drain regions which extend from about 100 Å to several hundred augtroms deep, channels are short as 400 to 500 Å can be produced.

The highly doped source and drain region of a p-channel MOSSIT can be formed by injecting boron ions through the Mo or W layer. In this case, the Si layer beneath the Mo or W layer is not sufficiently damaged by boron to form an amorphous Si layer, so that simultaneous implantation of the Si and B ions is effective.

As discussed in the foregoing, at least the n+ source region and p+ source region are formed as very shallow regions, for example, about 100 Å to 1,000 Å in depth. They are required to have an adequately high impurity concentration, for instance, about $1 \times 10^{21}$ cm$^{-3}$. Since their lattice constant must be the same as that of a substantially impurity-free region, compensation by combining impurities having different ionic radii is necessary. For example, As and P can be combined for the n+ region, and B and In for the p+ region. For lattice constant compensation in a very small region, it is preferred that two impurities in a ratio as close to 1:1 as possible be used.

A process for fabricating a MOSSIT of the present invention has been described above with particular reference to MoSi$_2$ or WSi$_2$ as the material for source and drain contact electrodes. It should be understood, however, that other materials such as TaSi$_2$ and TiSi$_2$ may be used as long as they provide a small contact resistance and are stable during heat treatment at elevated temperatures. The other requirement is that the material permit the selection of a high etching rate for the layer 95 in its lift-off step. If the gate insulating layer can be formed at lower temperatures by plasma oxidation, photo-excited oxidation or photo-excited plasma oxidation, materials that can be formed on Si by epitaxial growth, such as CoSi$_2$, NiSi$_2$, Pd$_2$Si and PtSi, become usable.

All steps, except for the formation of the gate insulating layer, that follow the formation of the silicide layer can be effected at low temperatures by using plasma or photo-excited CVD. These thus occurs little disturbance to the impurity distributions of the source and drain regions, and an abrupt transition region is retained at the interface between the substrate and channel. If the step of expitaxial growth is performed under UV irradiation by using ultra-purified material gases and reactive chamber, the desired crystal growth occurs at a temperature at least 100° C. lower than the conventionally possible level. Furthermore, a steep transition region is obtainable by combining UV irradiation and ultra-purified low pressure epitaxial growth.

Figure 8:
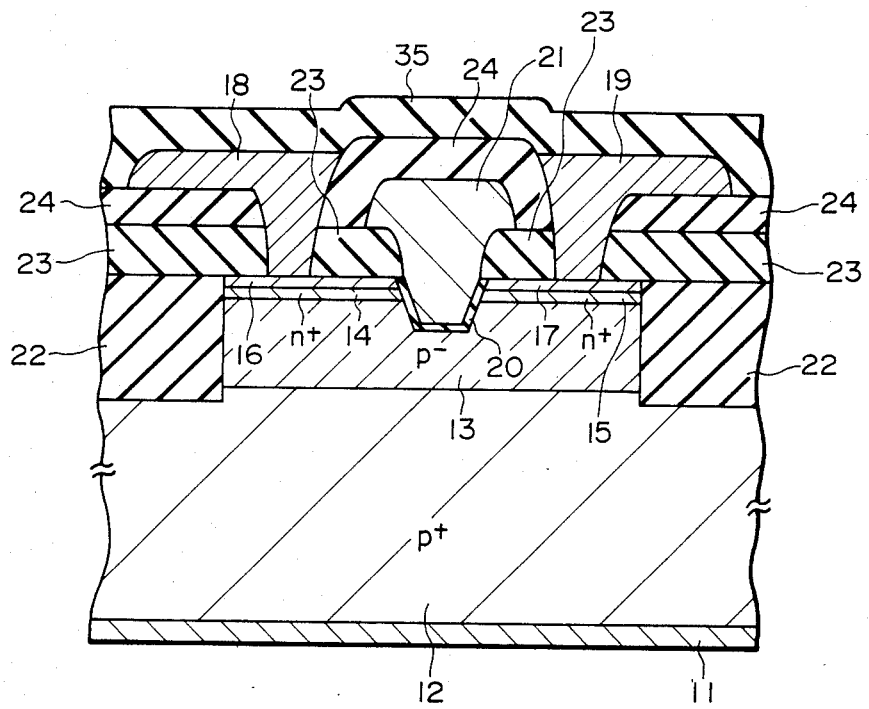

All steps following the formation of the gate insulating layer can be performed at a temperature not higher than 500° C. by using plasma or photo-excited CVD. Thus, the gate electrode may be formed of aluminum, which is suitable for the purpose of fabricating a MOSSIT having minimum physical dimensions because it has a higher diffusion potential with the source region and presents a low resistance. If the channel length is less than about 0.2 μm or 0.3 μm and the gate electrode is very small, it may have an excessively high resistance. To avoid this problem, the embodiment shown in FIG. 8 may be employed to advantage. In this embodiment, each of the source, gate and drain electrodes is formed from aluminum by CVD. Al film formed by low pressure plasma CVD has a very high step coverage and can be satisfactorily deposited within a small hole. The device of FIG. 8 has a protective PSG or Si$_3$N$_4$ film formed by plasma or photo-excited CVD.

Figure 9A:
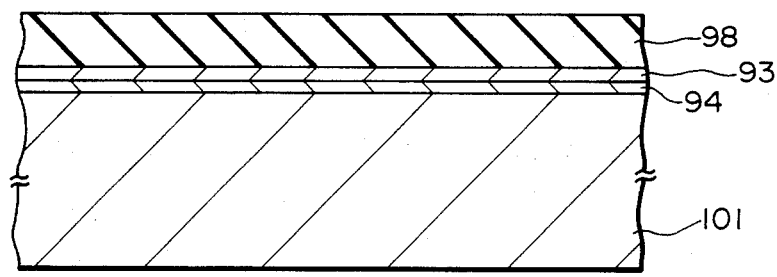
Figure 9B:
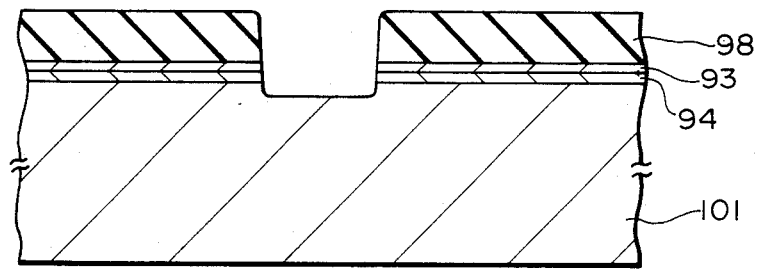

Another process sequence for fabricating an MOSSIT of the present invention will now be described with reference to the diagrams of FIGS. 9A to 9E. First, a Mo film having a thickness of 100 Å to several hundred angstroms is formed on a silicon substrate 101 by sputtering, vacuum evaporation or CVD. Arsenide (As) ions (in the case of an n-channel MOSSIT) or boro (B) together with Si (for a p-channel MOSSIT) are implanted through the Mo film to a depth generally equal to or slightly greater than the thickness of the Mo layer. After thorough ion implantation, the assembly is annealed at about 600° C. to form a MoSi$_2$ layer 93. By heating the assembly at a slightly higher temperature, the implanted impurities are completely activated to form a highly doped n+ or p+ layer 94. Subsequently, a SiO$_2$ or PSG film 98 is formed on the MoSi$_2$ layer by atmospheric CVD, low pressure CVD, plasma CVD or photo-excited CVD (FIG. 9A). The ordinary CVD process using N$_2$-SiH$_4$-N$_2$O gas requires heating at between about 600° and 800° C., but this temperature can be reduced to between 300° and 400° C. by using N$_2$-SiH$_4$-O$_2$ gas. Following a photo-lithographic step, the SiO$_2$ or PSG film 98 is removed by reactive ion etching (RIE). The exposed MoSi$_2$ and Si layers are etched away by RIE using a CCl$_4$-O$_2$ gas (containing several percent to 30% of O$_2$ FIG. 9B). The damaged Si layer can also be removed by RIE using Cl$_2$-Ar gas (Cl$_2$ content, 3 to 7%).

Figure 9C:
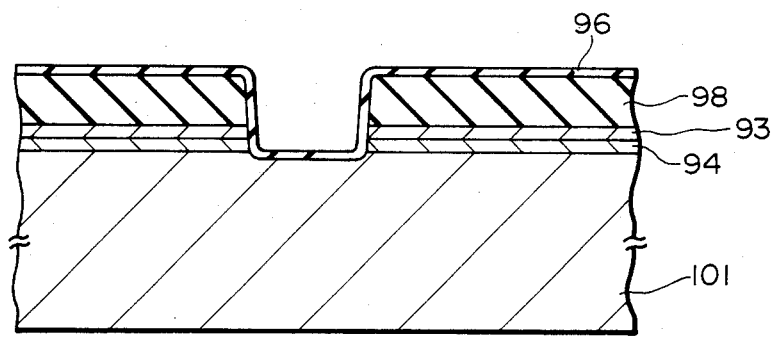

As mentioned above, the formation of an oxide gate insulating layer may be effected by thermal oxidation (dry oxidation). However, this involves heating to a temperature of 1,000° to 1,100° C. and may cause an excessively deep diffusion of B in the formation of a p-channel MOSSIT. This problem can be avoided if the gate insulating layer is formed by (H$_2$+O$_2$) combustion oxidation, plasma CVD using N$_2$-SiH$_4$-O$_2$ gas. This permits the use of low temperatures in the range of 350° to 600° C., eliminates practically all mobile ions, and provides a good film having a surface state concentration of $5 \times 10^{10}$ cm$^{-2}$ or less. The breakdown voltage of this film is at least $8 \times 10^6$ V/cm. FIG. 9C shows a SiO$_2$ film 96 formed by combustion oxidation or plasma CVD. Subsequently, an Al film is prepared from (CH$_3$)$_3$Al or AlCl$_3$ gas by plasma CVD. The Al film provided by CVD has a very high step coverage. (See T. Ito, T. Sugii and T. Nakamura, "Aluminum Plasma-CVD for VLSI Circuit Interconnections", Dig. Tech. Papers, 1982 Symposium on VLSI Technology.)

Figure 9D:
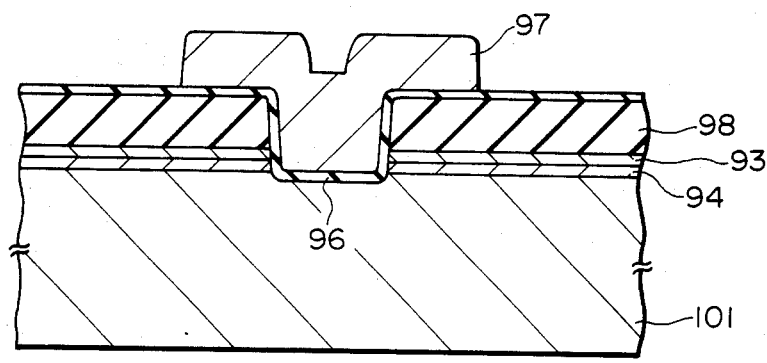
Figure 9E:
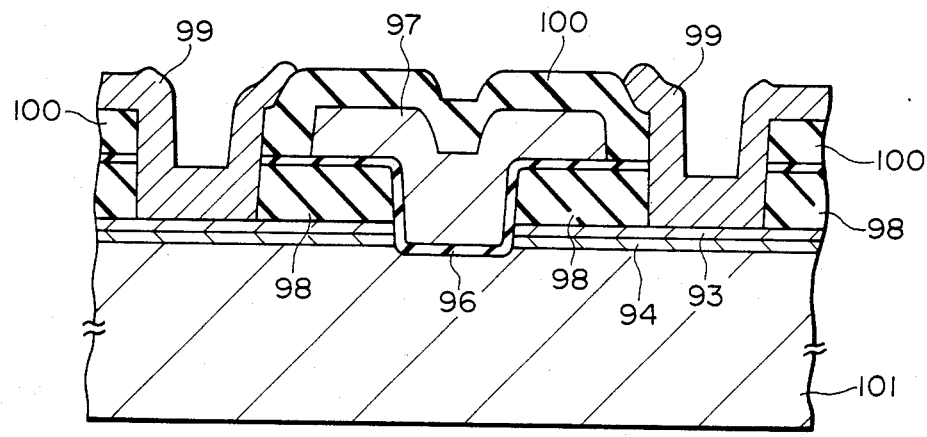

The next step is a photolithographic step for etching away the unwanted Al to leave only the area that forms a gate electrode 97 (FIG. 9D). After forming a PSG film 100 by CVD, contact holes for the source and drain are made, an Al layer is formed by CVD, and portions thereof are etched away to leave only the areas that serve as source and drain electrodes 99 (FIG. 9E). The removal of the Al film can also be effected by RIE using SiCl$_4$ as an etchant gas. RIE using SiCl$_4$ is free from the problem of "after-corrosion" that accompanies RIE using Cl$_2$, and with this method the etching rate of Al with respect to MoSi$_2$ can be as high as 200. (See Nakamura, Yamamoto and Sato, "High-Density, Multilayer Wiring With Redundant Contact-Hole Configuration", Papers on the Technical Group of Semi-conductor Devices SSD 82-51, The Institute of Electronics and Communication Engineers of Japan, August 1982). If the channel length is less than 0.5 μm, the gate electrode becomes so small that it has an excessively high resistance. This problem is effectively avoided in the embodiment of FIG. 9E where the gate electrode occupies a relatively large area.

Figure 10A:
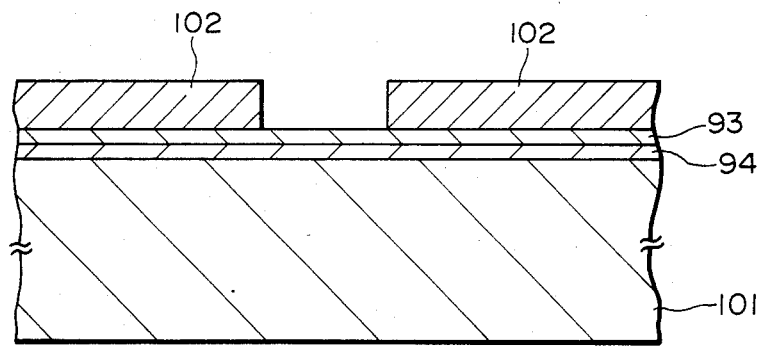
Figure 10B:
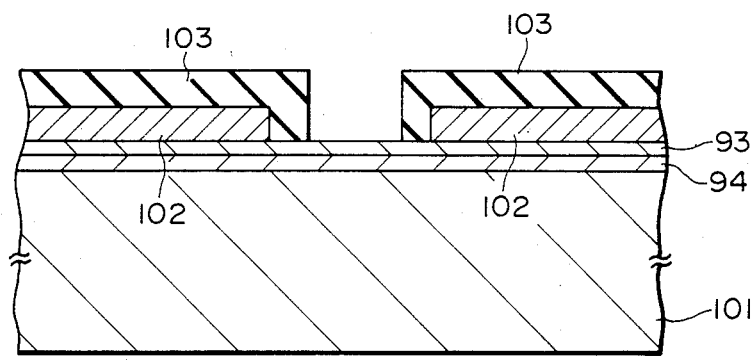

Still another process for fabricating a MOSSIT of the present invention will be described with reference to FIGS. 10A and 10B. The first step is to form a thin, highly doped layer 94 and a MoSi$_2$ layer 93 on the surface of a silicon substrate 101. On the layer 93, an Al layer 102 having a desired thickness is formed. Following a photolithographic step, a selected part of the Al layer is removed by RIE using $SiCl_4$ as an etchant gas (FIG. 10A). Since the ratio of selectivity for etching Al to that of $MoSi_2$ is as high as 200 to 1, the etching of Al ends exactly at the interface with the $MoSi_2$ layer. Thereafter, the surface of the Al layer is treated by anodization, or any other suitable method, to convert it to an insulating layer 103 such as $Al_2O_3$ (FIG. 10B). The subsequent steps may proceed as shown in FIGS. 9A to 9E. These include the formation of the Al film by plasma CVD, etching of the Al film, formation of the PSG film by CVD, making contact holes, and the formation of the Al film by plasma CVD.

The advantage of the embodiment of FIGS. 10A and 10B is that the Al film on the thin $MoSi_2$ layer reduces the resistance of each of the source and drain electrodes, and hence provides a MOSSIT particularly suitable for high-speed operation.

As described above, in an MOSSIT of the present invention, the length of the channel is reduced to about several hundred augstroms. Because the channel length is shortened, the operating characteristics of the device are improved. Furthermore, the MOSSIT of the present invention can be operated at a very high speed. Therefore, it can be effectively incorporated in an integrated semiconductor circuit as a drive transistor for a logic circuit or as a transistor in a dynamic RAM cell. Two MOSSITs of the present invention may be coupled in a CMOS configuration, which is particularly suitable for use in an integrated logic circuit, as a high-speed shift register, as a dynamic RAM of more than 1M bits, or as a static RAM.

The three processes described above for fabricating a MOSSIT of the present invention are merely illustrative, and other techniques may be used. In the illustrated processes, the channel region is formed by epitaxial growth, but in the embodiment of FIG. 4, a $p^+$ buried region may be formed by implanting boron ions into the surface of the $p^-$ substrate. Needless to say, the conductivity types used in the illustrated embodiments may be reversed. The foregoing description concerns only the case wherein a region of high impurity concentration having a conductivity type opposite that of the source region is formed beneath the channel region. However, the MOSSIT of the present invention achieves its object so long as it establishes a normally off characteristics using a high-resistivity channel region. Therefore, the concept of the present invention is well applicable to a semiconductor-on-insulator (SOI) device having a channel region formed on an insulating substrate such as $SiO_2$ film or sapphire.

We claim:

1. An insulated gate static induction transistor comprising:
    a semiconductor substrate;
    a source region and a drain region formed in a surface of said semiconductor substrate, said source and drain regions having high impurity concentrations;
    a channel region formed on said substrate extending between said source region and said drain region, said channel region having a length of 1 μm or less and a low impurity concentration of $1 \times 10^{15}$ cm$^{-3}$ or less, said length and said impurity concentration permitting punch-through between said source and drain regions;
    a high impurity concentration region having a conductivity type opposite to that of said source region formed beneath said channel region;
    a gate insulating layer extending into said channel region farther inwardly of said substrate than said source region and having a substantially flat inward surface parallel to said substrate surface, said source and drain regions defining a controlled current path therebetween through an internal portion of said channel region; and
    a gate electrode positioned on the flat surface of said gate insulating layer, wherein diffusion potentials of said substrate, said gate electrode and said source region provide a normally off characteristic, and wherein an exponential relationship exists between a non-saturating drain current characteristic and a drain voltage characteristic.

2. The insulated gate transistor of claim 1, wherein said source region is an $n^+$ region, and said gate electrode is made of $p^+$ polycrystalline silicon.

3. The insulated gate transistor of claim 2, wherein said gate electrode is overlaid with a material selected from the group consisting of silicides and metals.

4. The insulated gate transistor of claim 2, wherein said gate electrode is overlaid with a layer of annealed, boron-doped, silicon-rich molybdenum silicide.

5. The insulated gate transistor of claim 1, wherein said gate electrode is made of a material selected from the group consisting of Al, AlSi, $AlSi_2$, W, Mo, Pt, $MoSi_2$, $WSi_2$, $TaSi_2$, $TiSi_2$, $CoSi_2$, $NiSi_2$, $Pd_2Si$ and PtSi.

6. The insulated gate transistor of claim 1, wherein said source of region is formed by a method comprising the steps of: forming a layer of molybdenum or tungsten on said channel region; injecting impurity ions in a high concentration through said molybdenum or tungsten layer to convert portions of said channel region beneath said molybdenum or tungsten layer to an amorphous or near-amorphous state; and heating the device thereby formed.

7. The insulated gate transistor of claim 6, wherein said layer of molybdenum or tungsten has a thickness in a range of about 100 to several hundred angstroms, said impurity comprises arsenic, said impurity ions are implanted in a dose in a range of $1 \times 10^{15}$ to $1 \times 10^{16}$ cm$^{-2}$, and a depth of said portions of said channel region converted to an amorphous or near-amorphous state is equal to or slightly greater than said thickness of said molybdenum or tungsten layer.

8. The insulated gate transistor of claim 1, wherein:

$$\frac{L}{D} \gtrsim 1,$$

wherein L is an effective length of a channel between said source and drain regions and D is a depth of said channel region.

9. The insulated gate transistor of claim 1, wherein said source and drain regions have substantially equal depths.

10. The insulated gate transistor of claim 1, wherein said drain region is deeper than said source region.

11. The insulated gate transistor of claim 10, wherein said drain region extends past said channel region to said substrate.

12. A dynamic random access memory, said memory comprising a plurality of memory cells, each of said memory cells comprising an insulated gate static induction transistor, including:
- a semiconductor substrate;
- a source region and a drain region formed in a surface of said semiconductor substrate, said source and drain regions having a high impurity concentration;
- a channel region formed on said substrate extending between said source region and said drain region, said channel region having a length of 1 μm or less and a low impurity concentration of $1 \times 10^{15}\,\text{cm}^{-3}$ or less, said length and said impurity concentration permitting punch-through between said source and drain regions, and said drain region extending past said channel region to said substrate;
- a gate insulating layer extending into said channel region farther inwardly of said substrate than said source region and having a substantially flat inward surface parallel to said substrate surface;
- a gate electrode positioned on the flat surface of said gate insulating layer, diffusion potentials of said substrate, said gate electrode and said source region providing a normally off characteristic; and wherein an exponential relationship exists between a non-saturating drain current characteristic and a drain voltage characteristic;
- said source and drain regions defining a controlled current path therebetween through an internal portion of said source region;
- a conductive region in contact with said drain region;
- a polycrystalline silicon region in contact with said conductive region;
- a thin insulating layer formed over said polycrystalline silicon region; and
- a metal or low resistivity polycrystalline silicon electrode formed over said thin insulating layer.

13. The memory device of claim 12, wherein said thin insulating layer is made of a material selected from the group consisting of $SiO_2$, $Si_3N_4$ and $SiO_xN_y$.

14. The memory device of claim 12, wherein said thin insulating layer is made of $Ta_2O_5$.

15. The memory device of claim 12, wherein said conductive region is made of a material selected from the group consisting of polycrystalline silicon, tantalum and aluminum.

16. The memory device of claim 12, wherein at least one of said drain region and said substrate has an impurity concentration of not more than about $2 \times 10^{17}\,\text{cm}^{-3}$.

17. The memory device of claim 12, wherein said substrate comprises a p+ layer directly beneath said channel region and in contact with said drain region, and a p− layer beneath said p+ layer.

18. A complementary MOS transistor device comprising:
- a semiconductor substrate of a conductivity type;
- first and second insulated gate static induction transistors formed in said semiconductor substrate, said first and second insulated gate transistors being of opposite conductivity types, each of said insulated gate static induction transistors comprising:
  - a source region and a drain region formed in a surface of said semiconductor substrate, said source and drain regions having a high impurity concentration;
  - a channel region formed on said substrate extending between said source region and said drain region, said channel region having a length of 1 μm or less and a low impurity concentration of $1 \times 10^{15}\,\text{cm}^{-3}$ or less, said length and said impurity concentration permitting punch-through between said source and drain regions;
  - a high impurity concentration region having a conductivity type opposite to that of said source region formed beneath said channel region;
  - said source and drain regions defining a controlled current path therebetween through an internal portion of said source region;
  - a gate insulating layer extending into said channel region farther inwardly of said substrate than said source region and having a substantially flat inward surface parallel to said substrate surface; and
  - a gate electrode positioned on the flat surface of said gate insulating layer, wherein diffusion potentials of said substrate, said gate electrode and said source region provide a normally off characteristic, and wherein an exponential relationship exists between a non-saturating drain current characteristic and a drain voltage characteristic; and
- wherein said second insulated gate transistor as said high impurity concentration region a layer disposed between said channel region of said second insulated gate transistor and said substrate of a conductivity type opposite said conductivity type of said substrate.

19. The complementary MOS device of claim 18, further comrising an insulating region separating said drain region of said first insulated gate transistor from said drain region of said second insulated gate transistor.

20. The complementary MOS device of claim 18, wherein said drain of said first insulated gate transistor extends into contact with said drain of said second insulated gate transistor.

21. The complementary MOS device of claim 19, further comprising a thin silicide region covering said drain region of said first insulated gate transistor and said drain region of said second insulated gate transistor.

22. The complementary MOS device of claim 18, wherein said gate electrode of said first and second insulated gate transistors is made of a material selected from the group consisting of Al, AlSi, AlCu, W, Mo, Pt, $MoSi_2$, $WSi_2$, $TiSi_2$, $TaSi_2$, PtSi, $NiSi_2$ and $Pd_2Si$.

* * * * *